United States Patent
Clupper et al.

(10) Patent No.: US 6,309,742 B1
(45) Date of Patent: Oct. 30, 2001

(54) EMI/RFI SHIELDING GASKET

(75) Inventors: Thomas Clupper, Landenburg, PA (US); Carmine G. Meola, Elkton, MD (US); Bradley E. Reis, Wilmington, DE (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 09/493,424

(22) Filed: Jan. 28, 2000

(51) Int. Cl.$^7$ ........................................................ B23B 3/24
(52) U.S. Cl. .................... 428/304.4; 428/319.1; 428/314.8; 428/317.1; 427/247
(58) Field of Search ................ 428/319.1, 314.8, 428/317.1, 311.11, 312.2, 311.51, 304.4; 427/247, 244

(56) References Cited

U.S. PATENT DOCUMENTS

| | | |
|---|---|---|
| 3,549,423 | 12/1970 | Grubb et al. . |
| 3,555,168 | 1/1971 | Frykberg . |
| 3,646,496 | 2/1972 | Williams . |
| 3,666,526 | 5/1972 | Ettinger et al. . |
| 3,679,552 | 7/1972 | Jervis . |
| 3,707,401 | 12/1972 | Jarema et al. . |
| 3,739,076 | 6/1973 | Schwartz . |
| 3,761,231 | 9/1973 | Dowell et al. . |
| 4,076,888 | 2/1978 | Perugini et al. . |
| 4,110,552 | 8/1978 | Lombardi . |

(List continued on next page.)

FOREIGN PATENT DOCUMENTS

| | | |
|---|---|---|
| 1053932A | 8/1991 | (CN) . |
| 2 017 702 | 4/1970 | (DE) . |
| 2 006 463 | 9/1970 | (DE) . |
| 1 962 488 | 11/1970 | (DE) . |
| 2 000 896 | 11/1970 | (DE) . |
| 2 109 606 | 9/1971 | (DE) . |
| 0 038 104 | 10/1981 | (EP) . |
| 0 118 135 | 9/1984 | (EP) . |
| 0 140 664 | 5/1985 | (EP) . |
| 0 151 064 | 8/1985 | (EP) . |
| 0 368 612 | 11/1989 | (EP) . |
| 0 558 142 | 9/1993 | (EP) . |
| 0 692 546 | 1/1996 | (EP) . |
| 2043575 | 2/1971 | (FR) . |
| 1238183 | 7/1971 | (GB) . |
| 1242864 | 8/1971 | (GB) . |
| 1257796 | 12/1971 | (GB) . |
| 1284225 | 8/1972 | (GB) . |
| 917419 | * 5/1999 | (GB) . |
| 61-174700 | 8/1986 | (JP) . |
| 10-12557 | * 8/1999 | (JP) . |
| 9102117 | 12/1991 | (NL) . |
| 1724739 | 11/1989 | (RU) . |
| WO 91/01619 | 2/1991 | (WO) . |
| WO-0075395 | * 12/2000 | (WO) . |

OTHER PUBLICATIONS

RECEMAT Metal Foam Web Page, SEAC International B.V. Nov. 2, 1999.
Product Brochure—RETEC Porous Materials of ELTECH Systems Corporation Date Not Available.
Product Brochure—NITECH Nickel Foam for Battery Application, by NITECH Corporation—Jan. 1998.
Product Brochure—CELMET Porous Metal, by Sumitomo Electric Apr. 1997.

*Primary Examiner*—Tom Dunn
*Assistant Examiner*—Jonathan Johnson
(74) *Attorney, Agent, or Firm*—Allan M. Wheatcraft

(57) ABSTRACT

AN EMI/RFI gasket with an open-celled foam substrate having a metal coating on its skeletal structure that is substantially deformable and recoverable. The gasket provides shielding effectiveness of greater than 40 dB.

24 Claims, 5 Drawing Sheets

U.S. PATENT DOCUMENTS

| | | |
|---|---|---|
| 4,246,057 | 1/1981 | Janowski et al. . |
| 4,271,045 | 6/1981 | Steigerwald et al. . |
| 4,276,107 | 6/1981 | Pufahl . |
| 4,454,191 | 6/1984 | von Blucher et al. . |
| 4,526,826 | 7/1985 | Ten Eyck et al. . |
| 4,529,257 | 7/1985 | Goodman et al. . |
| 4,557,957 * | 12/1985 | Manniso . |
| 4,576,859 | 3/1986 | Oyachi et al. . |
| 4,647,714 | 3/1987 | Goto . |
| 4,764,422 | 8/1988 | Hill et al. . |
| 4,817,337 | 4/1989 | Lahita . |
| 4,857,668 | 8/1989 | Buonanno . |
| 4,931,479 | 6/1990 | Morgan . |
| 4,948,922 | 8/1990 | Varadan et al. . |
| 5,028,739 | 7/1991 | Keyser et al. . |
| 5,045,635 | 9/1991 | Kaplo et al. . |
| 5,061,899 | 10/1991 | Kudo . |
| 5,105,056 | 4/1992 | Hoge, Jr. et al. . |
| 5,115,104 | 5/1992 | Bunyan . |
| 5,130,024 | 7/1992 | Fujimoto et al. . |
| 5,134,244 | 7/1992 | Balsells . |
| 5,202,536 | 4/1993 | Buonanno . |
| 5,250,751 | 10/1993 | Yamaguchi . |
| 5,285,007 | 2/1994 | Deluca et al. . |
| 5,294,270 | 3/1994 | Fenical . |
| 5,418,685 | 5/1995 | Hussmann et al. . |
| 5,429,869 | 7/1995 | McGregor et al. . |
| 5,430,607 | 7/1995 | Smith . |
| 5,438,160 | 8/1995 | Batty . |
| 5,503,941 | 4/1996 | Pruyn . |
| 5,584,983 | 12/1996 | Pruyn . |
| 5,656,795 | 8/1997 | Miska . |
| 5,684,340 | 11/1997 | Soler et al. . |
| 5,738,907 * | 4/1998 | Vaccaro et al. . |
| 5,910,524 * | 6/1999 | Kalinoski . |
| 6,051,117 * | 8/2000 | Novak et al. . |
| 6,210,789 * | 4/2001 | Hanrahan . |

* cited by examiner

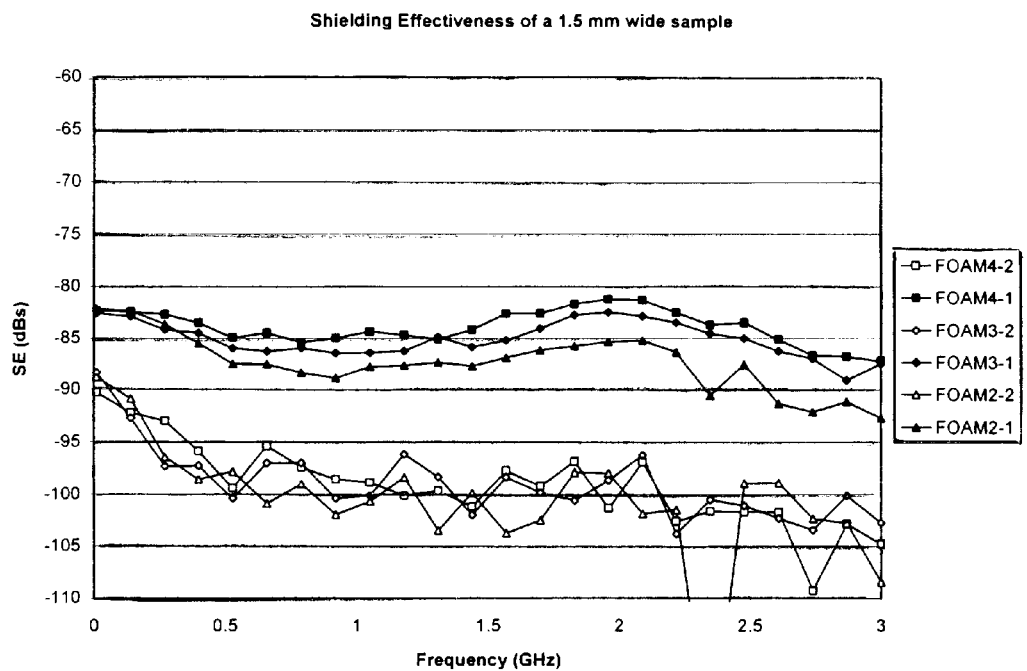
Figure #8: Shielding effectiveness data of 1.5mm wide metalized foam gasket at two different compression levels
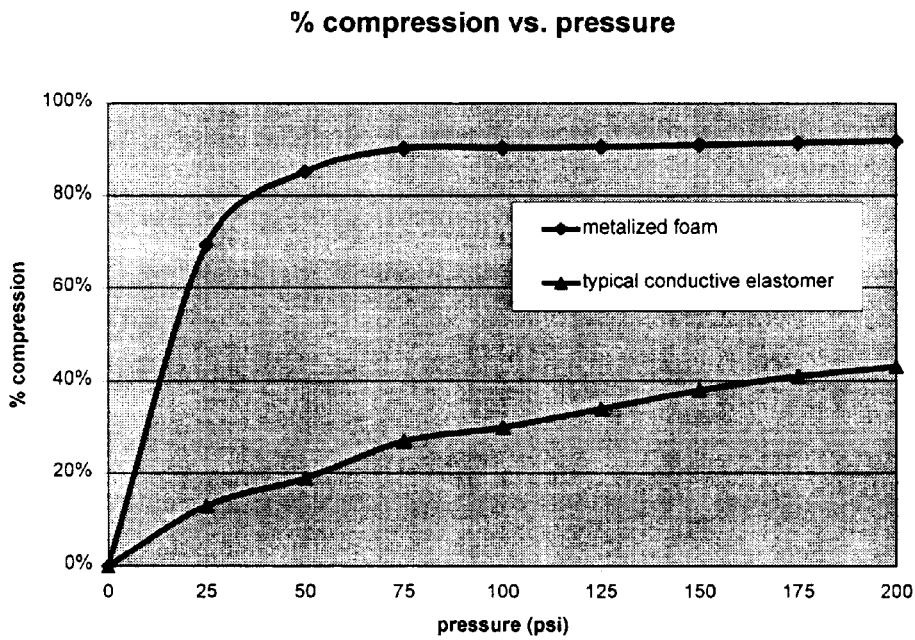
Figure #9: Compressibility of a metalized foam gasket compared to a typical conductive elastomer, as a function of applied pressure,

EMI/RFI SHIELDING GASKET

FIELD OF THE INVENTION

The present invention relates generally to the field of gaskets. More particularly, this invention relates to gaskets for electrical apparatus which may generate or which may be adversely affected by electromagnetic interference (EMI) and/or radio frequency interference (RFI) from gaps in shielding or conductive housings.

BACKGROUND OF THE INVENTION

Electromagnetic interference has been defined as undesired conducted or radiated electrical disturbances from an electrical or electronic apparatus, including transients, which can interfere with the operation of other electrical or electronic apparatus. Such disturbances can occur anywhere in the electromagnetic spectrum. Radio frequency interference is often used interchangeably with electromagnetic interference, although it is more properly restricted to the radio frequency portion of the electromagnetic spectrum, usually defined as between 10 kilohertz (kHz) and 100 gigahertz (GHz).

A shield is defined as a metallic or otherwise electrically conductive barrier inserted between a source of EMI/RFI and a desired area of protection. Such a shield may be provided to prevent electromagnetic energy from radiating from a source. Additionally, such a shield may prevent external electromagnetic energy from entering the shielded system. As a practical matter, such shields normally take the form of an electrically conductive cover or enclosure, which is electrically in contact with either: the ground trace on a PCB (printed circuit board); or another mating cover (with the PCB completely surrounded by and grounded to, the two cover halves). Any unwanted EMI/RFI energy is thereby dissipated harmlessly to ground. Most such enclosures or shields are open on at least one side, or are provided with access panels, doors and/or removable lids. Thus, the shields have at least one removable interface, which is typically used to allow the user to gain access to the electronic circuitry underneath.

Gaps that form at the removable interface (typically between the shield and the PCB or between the two shield halves) provide an undesired opportunity for electromagnetic energy to leak into the shielded system. The gaps also can interfere with electrical current running along the surfaces of the shield, as well. For example, if a gap is encountered, the impedance of the gap is such that electromagnetic energy may radiate from an opposing side of the gap, much like a slot antenna. A device used to fill such gaps is known as a gasket. As used herein, a "gasket" is defined as a device that fills a gap in a shielded system at a removable interface, such as between a shield and a PCB, or between two shields, with a PCB enclosed therein, for example.

Various configurations of gaskets have been developed over the years to conformably fill these gaps and to effect the least possible disturbance of the ground conduction currents. Each seeks to establish an electrically conductive path across the gaps—the higher the conductivity, the better. However, there are inevitable compromises between: the ability of the gasket to smoothly and thoroughly engage and conform to the surface of the shield and its mating surface; the conductive capacity of the gasket; the gasket's resilience; the gasket's softness; the ease of mounting the gasket; and the cost of manufacturing and installing the gasket.

Presently, many electronic devices, such as but not limited to: pocket pagers, cellular phones, laptop computers and wireless local area networks (LANs), are constructed using metallized plastic injection-molded shields which are not manufactured to exact tolerances. Therefore, the aforementioned gaps in these systems can be quite significant. Typically in such devices, mating shield members incorporate a snap-together method of closure, or in other instances, they utilize a limited number of light gauge screws. Accordingly, most electronic devices having metallized plastic injected molded housings, cannot deliver substantial closure force to assemble a housing/PCB system together. Any EMI gasket that is incorporated into such electronic devices must therefore be deformable under a low compression force. If the gasket material is too hard, it will not conform to the irregular surfaces between the housing and cover, and therefore, the gaps will not be completely sealed. These gaps can sometimes be so large that slots are created, from which electromagnetic energy can escape. Additionally, a gasket material that is difficult to compress can result in bending or bowing of the shield and PCB, which can result in many other mechanical problems, such as stress relaxation in the plastic shield, problems with solder joints cracking on the bowed PCB, etc. Therefore, it is imperative that the gasket material is soft enough to conform to irregular surfaces when: the fastener spacing is large, the stiffness of the shield(s) and/or PCB is very low, and when only a small amount of force is available from the snaps or screw fasteners.

Conventionally, conductive particle-filled silicone elastomers have been utilized as conductive gaskets, to reduce EMI and RFI. However, such materials tend to be relatively hard (typically Shore A hardness of 45 or greater). Because of their hardness, these conductive elastomers are not well suited for use as a gasket in a device having a shield that is assembled with a substantially low closure force. Additionally, these conductive elastomers are difficult to manipulate when formed or die-cut into complicated gasket patterns, with narrow gasket sections. Since cellular phone EMI shields, for example, utilize lightweight, flexible and extremely small plastic parts, an alternative to hard, conductive elastomers is desired in the industry.

Other EMI/RFI shielding gaskets have been proposed which incorporate a conductive fabric or mesh which surrounds a soft, conformable foam material. Examples of such gaskets are disclosed in U.S. Pat. Nos. 5,028,739; 5,115,104; 4,857,668; 5,045,635; 5,105,056; 5,202,526; and 5,294,270. Although the gaskets disclosed in the foregoing U.S. patents may be deformable under a low compression force, these gaskets do not have continuous conductivity throughout the material. These gaskets are typically constructed of an inner, non-conductive foam support material that is wrapped with a metallized, conductive fabric, rendering only the outer fabric surface conductive. Continuous conductivity, throughout the entire cross-section of the material, is required for proper EMI shielding. Because they are not continuously conductive, these gasket materials cannot therefore be die-cut into arbitrary, complex shapes to function as an EMI/RFI gasket. The ability to die-cut a material (into such a complex shape) is especially important for multi-cavity enclosures with narrow walls, typically less than 3 mm in width.

U.S. Pat. No. 4,931,479 describes a conductive polyurethane foam material, which is rendered conductive by filling a base material with conductive particles and then "foaming" the base material. One suggested conductive particle is carbon. Although such a conductive polyurethane foam material may be effective for use in certain applications (particularly ESD—electrostatic discharge applications), it is not sufficiently conductive for use as an EMI/RFI shielding gasket in the frequency range from about 10 MHz to about 26 GHz. Additional suggested conductive fillers are metallic particles such as silver, nickel, copper, nickel-plated graphite, silver-plated glass, silver-plated nickel, and silver-plated copper, for example. However, for such a shielding gasket to be effective in the frequency range from about 10 MHz to about 26 GHz, the base material would probably have to be loaded with such a high density of metallic conductive particles that the gasket would probably exhibit poor mechanical properties. Such mechanical properties might be softness, recoverability, tensile strength, etc.

U.S. Pat. No. 3,666,526 discloses an electrically conductive metallized porous foam. In theory, such a material could potentially be used as a conformable EMI gasket, however, there are several practical problems with this. First, such metal foams are typically heavily coated with metal and subsequently sintered, removing the base polymer foam structure. This makes the structure more difficult to compress, as well as reduces the possibility for the gasket material to recover to its original height, once compressed. Dimensional recoverability is a critical feature for an EMI gasket to maintain, since this can also affect electrical performance over time. Also, particulation of the metal coating because of its coating thickness, may be an issue, with this type of solution.

An attempt to overcome the problems of recoverability and particulation was disclosed in patent number U.S. Pat. No. 4,576,859, for example. The invention is described as a metallized foam material with a conductive outer coating of rubber and/or plastic surrounding an inner, metal coating surface on a foam substrate. This conductive outer coating was provided to aid in resilience (recoverability) and also to prevent the metal coating from peeling off of the skeletal structure of the foam, thereby preventing particulation. This extra coating process adds both complexity and cost to the final article that detracts from its use as an EMI gasket. Also, since most particle-filled conductive coatings are not typically as conductive as the metal coating itself, this added step may also reduce the gasket's electrical performance. Also, U.S. Pat. No. 4,576,859 describes a material that has a relatively low pore density, between 10 and 40 cells per linear 25.4 mm. This makes the product extremely difficult to handle and install, especially when die-cut or formed into narrow, complicated shapes.

An EMI or RFI shielding gasket material which is substantially deformable under low pressure, dimensionally recoverable, able to be handled and installed when die-cut or formed into narrow-walled, complicated shapes, and simultaneously, continuously electrically conductive throughout the structure of the material, is desirable. With sufficient electrical conductivity, such a material would be able to provide excellent EMI shielding in a frequency range from about 10 MHz to about 26 GHz, while being compatible with the use of lightweight plastic shields, snap features, and thin PCB's. Also desirable is such a gasket that is adapted for rapid and efficient application to a PCB or an EMI/RFI shield.

SUMMARY OF THE INVENTION

The present invention provides an electrically conductive gasket that includes an open-celled foam substrate having a skeletal structure; a metal coating deposited onto the skeletal structure; in the absence of a substantially non-metallic conductive coating over the metal; wherein the gasket has a volume resistivity of less than 10 ohm-cm; wherein the gasket is substantially deformable with less than 50 psi of pressure; and wherein the gasket is substantially recoverable after the pressure is removed. The foam substrate has a pore density of 40 to 250 pores per 25.4 mm, and preferably between 80 and 140 pores per 25.4 mm. The thickness of the foam substrate is less than about 10 mm in an uncompressed state, and preferably between 0.5 mm and 3.0 mm.

In another aspect, the invention provides an electrically conductive gasket as discussed above wherein the gasket has a surface and further includes an adhesive disposed on the surface. The adhesive is preferably a conductive adhesive.

In another aspect, the invention provides an electrically conductive gasket as discussed above wherein the gasket has a surface and further includes a metal foil attached to the surface. The metal foil is preferably attached to the surface by an adhesive. In an alternative embodiment, an adhesive is disposed on an outer surface of the metal foil.

In all aspects of the invention, the metal coating is selected from a group consisting essentially of copper, nickel, tin, gold, silver, cobalt and palladium and mixtures and combinations thereof. Preferably, the metal coating is nickel. The metal coating is deposited onto the open-celled foam by conventional techniques, such as an electrolytic process, an electroless process, sputtering, chemical vapor deposition, physical vapor deposition, or any combination thereof. More than one metal coating layers is applied in alternative embodiments. For example, the metal in one embodiment is deposited by first sputtering the metal onto the foam and then electroplating the metal or another metal onto the foam.

In an aspect of the invention, the metal coating is present in an amount less than 150 g/m$^2$, preferably less than 125 g/m$^2$, more preferably less than 100 g/m$^2$, still more preferably less than 50 g/m$^2$, and most preferably, about 35 g/m$^2$. The metallic coating preferably has a total thickness in an amount of less than 5 microns, and most preferably between 1 and 5 microns.

The electrically conductive gasket of this invention achieves a shielding level of greater than 40 dB in a frequency range from about 10 MHz to about 3 GHz.

In another aspect, the invention provides a method of filling a gap in an EMI shielded system by disposing the gasket of the invention in the gap.

BRIEF DESCRIPTION OF THE DRAWINGS

FIG. 8 is a graph of the shielding effectiveness data of a gasket according to an exemplary embodiment of this invention.

FIG. 9 is a graph of the compressibility of a gasket according to an exemplary embodiment of this invention.

DETAILED DESCRIPTION OF THE INVENTION

In one exemplary embodiment, the present invention provides an electrically conductive gasket having a metallized, open-celled foam substrate having a skeletal structure and being both recoverable and substantially deformable under low pressure. As used herein, the term "open-celled" means having between 40 and 250 pores per 25.4 mm measured in any direction; the term "substantially deformable" means able to be compressed to at least 20% of original thickness; the term "low pressure" means less than 50 pounds per square inch (psi); and the term "substantially recoverable" means able to recover to at least 5% of the amount it is compressed within one minute after the compression pressure is removed. Preferably, the gasket of the present invention is able to recover to at least 10% of the amount it is compressed, and most preferably at least 20%.

The metallization of the foam is in the form of metallic coating on the skeletal structure of the foam. The metallic coating is preferably deposited on the majority of surfaces throughout the open-celled foam substrate on the skeletal structure.

Figure 1:
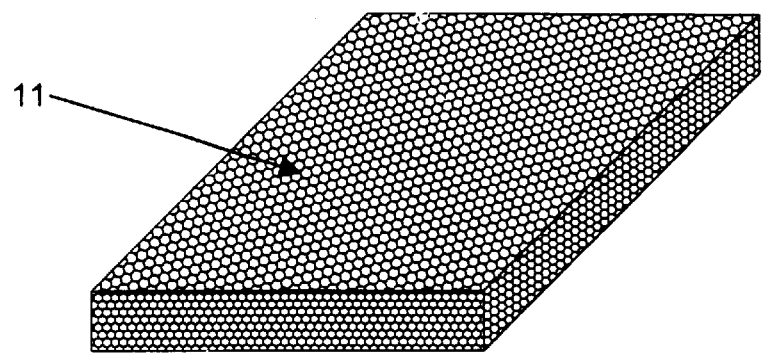
FIG. 1 is a perspective view of a gasket according to an exemplary embodiment of the present invention.
Figure 1A:
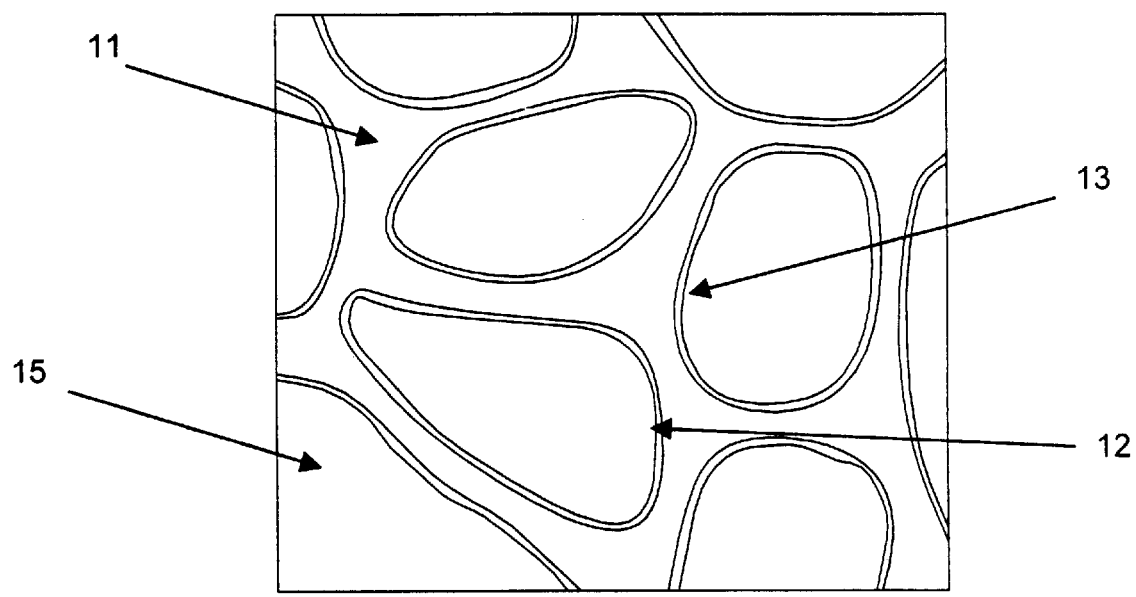
FIG. 1A is a cross-sectional view of a portion of the gasket shown in FIG. 1.
Figure 1B:
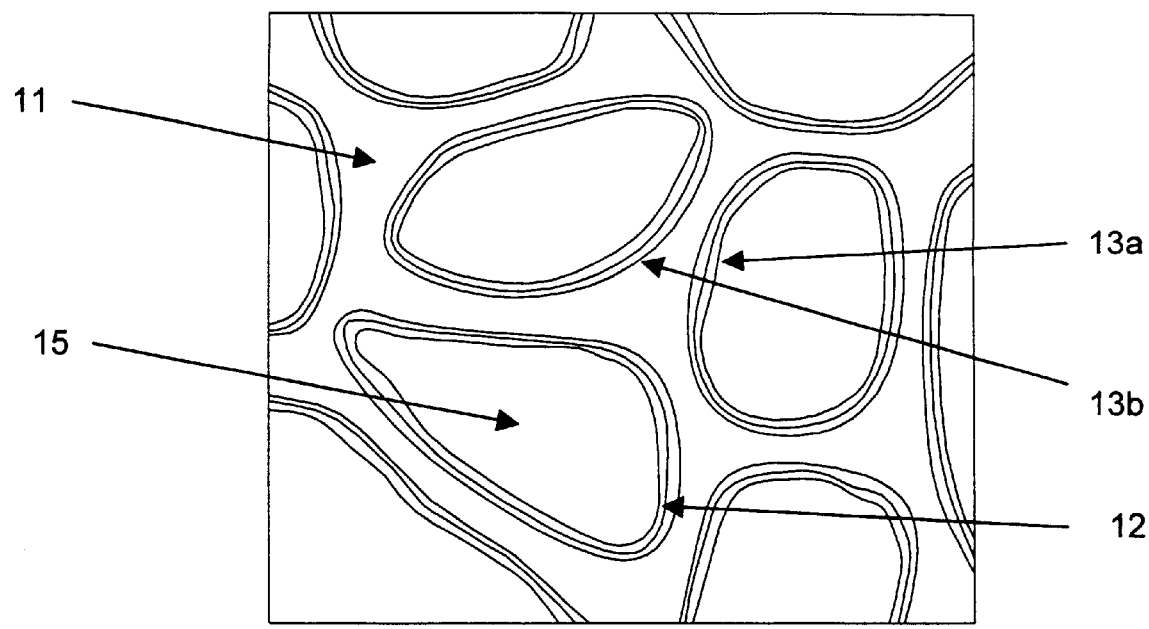
FIG. 1B is a cross-sectional view of a portion of the gasket shown in FIG. 1.

With reference to FIG. 1, a gasket 10 is illustrated in accordance with this embodiment of the invention. An open-celled foam 11 is used as the substrate. The foam has a skeletal structure defining cells (or pores) 12. The skeletal structure is coated with a metal coating 13. FIG. 1A is a cross-section of gasket 10 showing several individual cells 12. Each cell 12 preferably has its surfaces, formed by foam 11, coated with metal coating 13, and leaving an open space 15 within cell 12. As shown in FIG. 1B, metal coating 13 may alternatively be two or more distinct metal coating layers 13a and 13b.

The metal coating may be accomplished through several techniques, such as, but not limited to electrolytic plating, electroless plating, sputtering, vacuum deposition, etc. Combinations of these metallization techniques may also be used, such as described in patents U.S. Pat. No. 5,503,941 and U.S. Pat. No. 5,584,983, which utilize a sputtered precoating of metal, followed by a final electroplated coating layer. A typical electroless plating process for such a material is described in patents EP 917,419, Russian 1,724,739, and Chinese 1,053,932. All of the abovementioned patents are incorporated herein by reference.

Whichever metallization process is used, however, it is critical that the gasket be sufficiently coated with metal throughout the foam substrate to provide proper through-conductivity, yet not overly coated with metal such that the metallized foam becomes difficult to compress and/or insufficiently resilient. A preferred metallization coat weight is between 5 grams/square meter and 150 grams/square meter. This value will change with various metallization techniques, metal types, foam thicknesses, pore densities, etc., as will be recognized by one skilled in the art. In a most preferred embodiment of the invention, 35 grams/square meter of nickel is used for a foam of approximate thickness of 1.6 mm, with a pore density of approximately 94 pores per 25.4 mm.

Since weight per area is a simple and effective way to measure the quantity of metallization on the base foam material, it is often used. Other measurement techniques may also be used to gain a measurement of the actual coating thickness (rather than the weight per area), such as SEM (scanning electron microscopy), for example. These techniques are typically much more difficult to employ, but allow the actual coating 13 thickness to be measured by taking a cross-section of an individual metallized foam cell 12. This has the advantage of eliminating a limitation of a weight per area measurement, specifically that it varies according to a foam thickness and pore density, for example. A preferred total metal coating thickness, which may be measured by SEM, is about 2.0 to 3.5 microns.

The open-celled foam 11 used as the substrate for gasket 10 may be a skived sheet of non-pigmented ester-type polyurethane reticulated foam. The foam could also be made of polyethylene, polypropylene, polyvinyl chloride, ether-type polyurethane, polyamide, polybutadiene, or silicone. For the purposes of the invention, any open type of open-cell foam substrate may be used.

The pore density of the open-cell foam substrate in the present invention should be greater than 40 pores per 25.4 mm, measured in any linear direction. Preferably, the pore density would be as large as possible, while still being able to be properly and sufficiently coated with metal, and while also still being able to maintain the appropriate compressibility and resiliency properties desired. Using a high pore density enhances the mechanical stability and recoverability of the metallized foam material, especially when cut into narrow sections. Using a high pore density also serves to allow for more electrical pathways through the material, resulting in improved through-electrical conductivity.

The metal coating is preferably copper, nickel, tin, gold, silver, cobalt or palladium, or mixtures thereof. In a preferred embodiment of the invention, nickel is used for the metal coating, which has a desirable combination of mechanical and electrical properties, environment/corrosion resistance, ability to be coated, and cost.

The thickness of the open-celled foam substrate is preferably from about 0.1 to 5.0 mm in thickness, and most preferably in the range of 0.5 to 3.0 mm to accommodate most EMI shielding applications.

Figure 6:
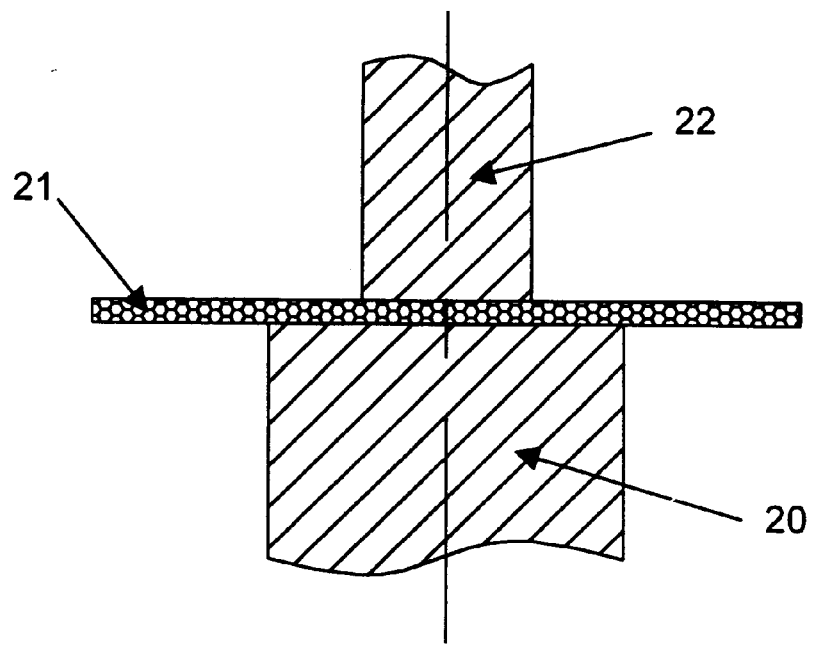
FIG. 6 is a cross-sectional drawing of a compression force test apparatus.

It is a purpose of the present invention to provide an EMI/RFI shielding gasket that is substantially deformable under a low pressure. To determine what this low pressure is, a simple test is used to compare various gasket materials. The test apparatus is illustrated in FIG. 6. The test apparatus includes a 38.1 mm diameter cylindrical bottom anvil 20, a sheet sample of a gasket 21, and an 18.1 mm diameter cylindrical top anvil 22. Top anvil 22 and bottom anvil 20 are aligned coaxially with gasket 21 between them. A force/distance measurement apparatus such as that available from Instron Corp., Canton, Mass. is used to compress the material by a given percentage of its original thickness. The force to compress the gasket to this thickness is then recorded. Typical anvil materials are made from hardened steel, and are fabricated to a 32 RMS surface finish, or better. Also, care must be used to correct for the displacement due to the potential deflection of the test apparatus itself, under the loads considered. Calculations are then made to convert the force and area of the material tested into a pressure value, using P=F/A.

Traditional EMI gasket materials typically require 50–250 psi of pressure to be compressed by 20% of their original thickness. The newly invented gasket material only requires 5–10 psi in order to deflect it by the same 20% of its original thickness. Additionally, traditional conductive elastomer EMI gasket materials cannot be compressed by more than 50%, without requiring substantially more than 250 psi of pressure. The newly invented metal foam gasket material can be compressed by 90% of its original thickness, with only 50–75 psi. FIG. 9 shows percent compression vs. applied pressure, for a typical conductive elastomer, versus a preferred embodiment of the newly invented gasket using the test apparatus described above. The typical conductive elastomer used for this comparison was a silver-filled silicone, form-in-place type gasket commercially available from Chomerics under the tradename Cho-Form 3.0, and the newly invented gasket had a nickel metal loading of 35 grams per square meter deposited according to the method described in U.S. Pat. No. 5,503,941 on a polyurethane foam substrate that was 1.60 mm thick and had a density of approximately 94 pores per 25.4 mm.

Using the apparatus as above, along with gold-plated anvils and a micro-ohmmeter utilizing a four-point probe (Kelvin) measurement technique, the volume resistivity of the gasket may be obtained using the following equation:

$$VR=(R \times A)/t$$

where VR is the volume resistivity of the material, R is the through-resistance of the material, A is the area of the die-cut gasket (identical to the area of the smaller, top probe), and t is the thickness of the metallized foam material (in the compressed state, at the desired thickness). It is generally desirable to have volume resistivities for EMI shielding gaskets much less than 10 ohm-cm. It is preferable, however, to have such values as low as possible, in the region of less than 0.1 ohm-cm.

Another mechanical property of the gasket material that is of interest, is recoverability (or resiliency), which is the ability of the material to recover to some percentage of its original thickness, after compression for a period of time. Recoverability is defined by the following equation:

$$R=100*(T_2-T_1)/(T_0-T_1)$$

Where R is the recoverability (expressed as a percentage), $T_0$ is the original thickness of the gasket material in its initial, uncompressed state, $T_1$ is the thickness of the gasket in its desired, compressed state, and $T_2$ is the thickness of the gasket in an uncompressed state, after compression. While it is most desired to have a recoverability of 100%, a minimum acceptable recoverability value is about 5%.

A simple test for recoverability is as follows. First, the thickness of the metallized foam substrate is measured, using any one of a number of non-contact or low-force measurement techniques. Then, the material is placed between two anvils (similar to those described in the aforementioned compressibility test) and compressed to a fixed thickness, using screws and mechanical compression stops. The material is then left compressed for a given amount of time, and then the thickness of the material is re-measured in the uncompressed state approximately one minute after the compression pressure is removed. The time that the material is left compressed can vary, from just a few seconds, to months or years. Also, extreme environmental conditions can be applied to the sample (preferably while in its compressed state), to simulate accelerated life conditions. Table #1 below reveals the recoverability properties of a preferred embodiment of the invention (having the construction described above), after short-term (10 seconds at 20° C.) and long-term (24 hours with 29 temperature cycles of between 40° C. and +85° C.) under compression.

TABLE #1

Recoverablility Data of Preferred Embodiment

| Pre-compressed Thickness | Compressed Thickness | Recovered Thickness After Short-term Testing | Recovered Thickness After Long-term Testing | Recovered Percentage After Long-term Testing |
| --- | --- | --- | --- | --- |
| 1.6 mm | 0.4 mm | 1.6 mm | 0.8 mm | 33% |

Figure 7:
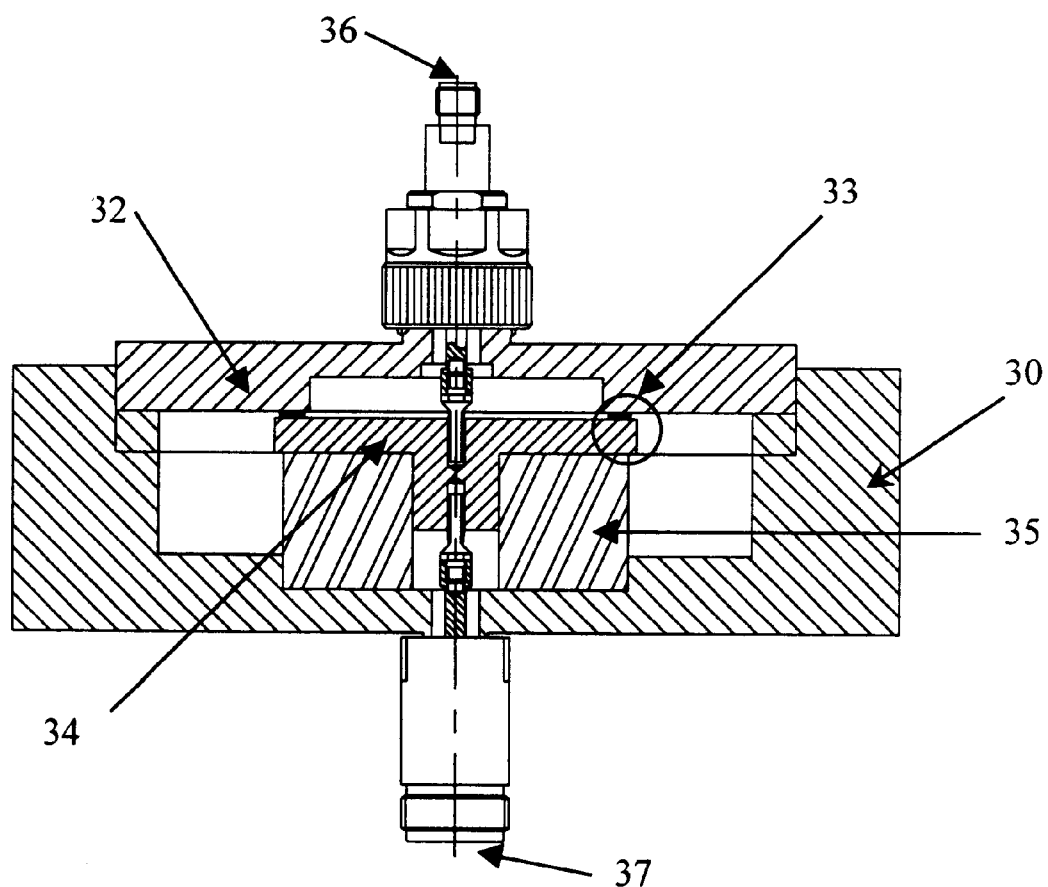
FIG. 7 is a cross-sectional drawing of an EMI gasket test apparatus.

To determine the electrical performance of a preferred embodiment of the present invention, a custom test fixture was developed that provides accurate and repeatable measurements on the shielding effectiveness of the metallized foam material. The test fixture, illustrated in FIG. 7, is based on the industry standard ARP-1705, which is a technique that uses a coaxial-type fixture to measure the transfer impedance through an EMI gasket seal. With the use of a modern network analyzer, it becomes much easier to make large dynamic range insertion measurements of devices. Therefore, a coaxial "cell" was developed which could be used with a network analyzer. The shielding effectiveness can then be directly measured using S-parameters obtained from the network analyzer.

In FIG. 7, the main body 30 of the fixture is a large cylindrical part that has four air cylinders (not shown) mounted to it. The cylinders apply pressure to a top plate 32, which in turn compresses a sample of a gasket 33, thereby applying pressure to a bottom plate 34 and the main body 30. A dielectric support disc 35 supports the bottom plate 34. This arrangement provides a completely shielded enclosure that permits accurate and repeatable S.E. (shielding effectiveness) measurements.

With the fixture loaded with a gasket 33 under test, a signal is injected from a network analyzer (not shown) into a top coaxial port 36. If any signal "leaks" through gasket 33, it will continue through the coaxial test fixture and out a bottom coaxial port 37. The ratio of these two signals will yield a transmission coefficient, which when converted to "dB", yields the shielding effectiveness of the gasket under test. The apparatus should be designed and calibrated to ensure that the impedance mismatch effects of the fixture are minimized. FIG. 8 is a data plot graphically depicting shielding effectiveness of the inventive gasket material shown in FIG. 1 and described above (with a nickel metal loading of 35 grams per square meter deposited according to the method described in U.S. Pat. No. 5,503,941 on a polyurethane foam substrate that was 1.60 mm thick and had a density of approximately 94 pores per 25.4 mm). A doughnut-shape of this gasket was die-cut to yield a 50.8 mm outer diameter and a gasket width of 1.5 mm. The sample was then inserted into the EMI gasket test fixture, which was described previously and shown in FIG. 7. Shielding effectiveness was calculated by the following method:

Shielding Effectiveness=20 log (τ); where

τ=Transmission Coefficient magnitude; and

τ=Vout/Vin
Vout=Voltage at the output of the test fixture
Vin=Voltage at the input of the test fixture In the data plot of FIG. 8, the Y-axis is the Shielding Effectiveness expressed in dB, and the X-axis is the Frequency expressed in GHz. The top line on the Y-axis represents −60 dB S.E., and each division equals 5 dB. There were three identical samples of a preferred embodiment of the material tested, at two different compression levels. Samples indicated by −1 on the graph's legend, were compressed to 0.55 mm, while −2 samples were compressed to 0.45 mm. The original, uncompressed thickness of the metallized foam material was 1.60 mm. The graph illustrates that the gasket of the present invention does indeed provide effective shielding at both compression levels.

Figure 2:
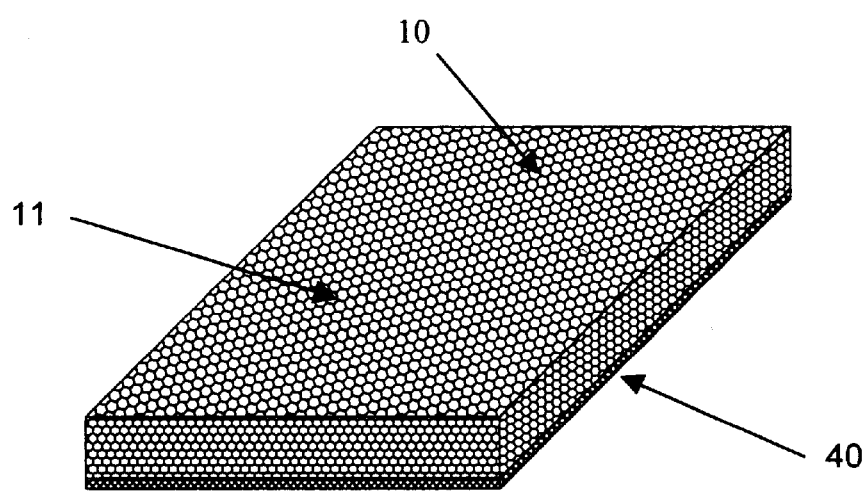
FIG. 2 is a perspective view of a gasket according to an another exemplary embodiment of the present invention.

Another embodiment of the present invention is an EMI/RFI shielding gasket that is substantially and continuously conductive throughout the structure of the material, also having an adhesive 40 provided on a surface 11b of gasket 10 described above, as illustrated in FIG. 2. Adhesive 40, which is preferably electrically conductive, is typically used to secure gasket 10 to a particular face of the EMI shield or PCB in a robust and secure manner. Non-conductive adhesives may be used, but they may significantly reduce the EMI shielding performance of the gasket.

Figure 3:
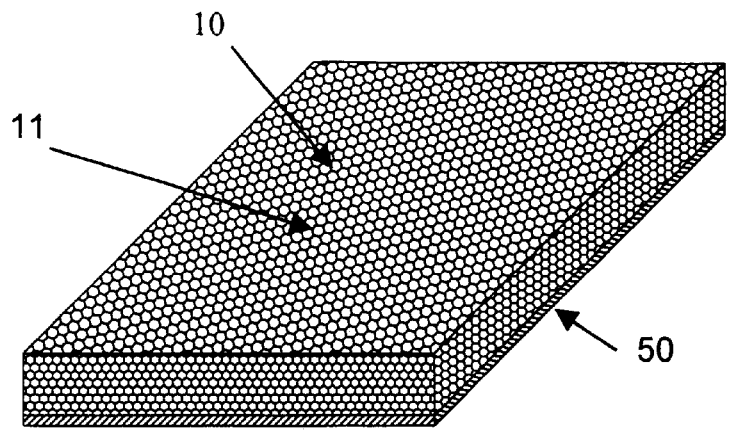
FIG. 3 is a perspective view of a gasket according to an another exemplary embodiment of the present invention.
Figure 4:
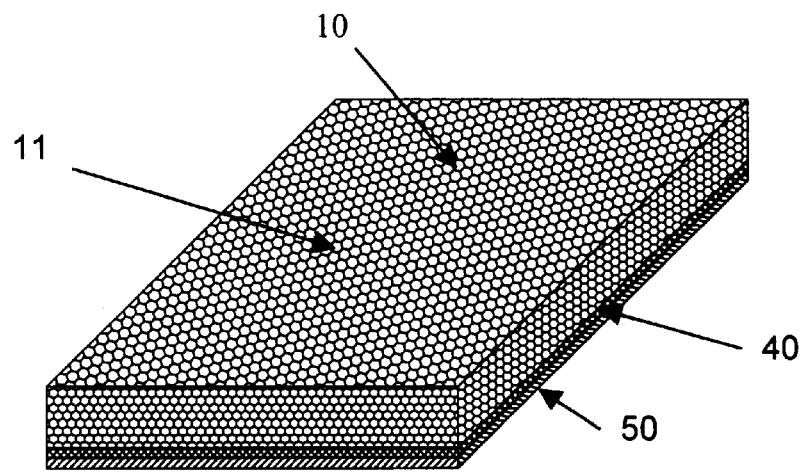
FIG. 4 is a perspective view of a gasket according to an another exemplary embodiment of the present invention.
Figure 5:
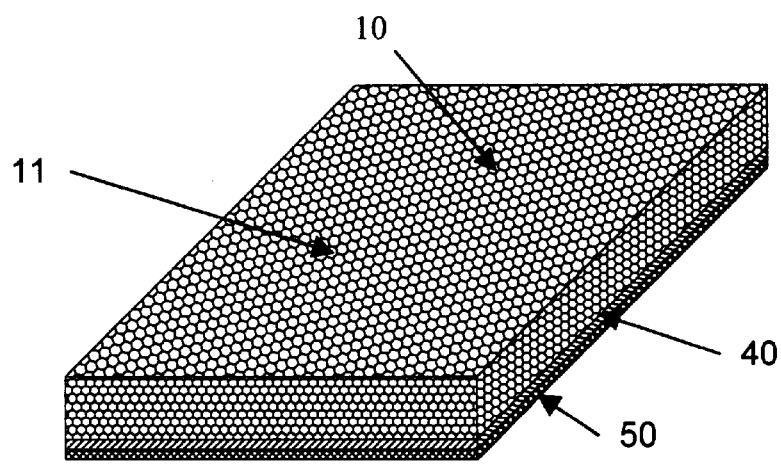
FIG. 5 is a perspective view of a gasket according to an another exemplary embodiment of the present invention.

Also, in yet another embodiment of the present invention, a metal foil 50 is attached to gasket 10, as illustrated in FIG. 3, in order to provide dimensional stability and improved ability to be handled and installed. Foil 50 may be made from any electrically conductive material (e.g., annealed metal, metal-plated plastic, etc.), but is preferably either aluminum, copper, nickel, steel, tin, or silver, and is preferably between 0.01 and 0.1 mm thick. An optional adhesive 40 attached to the outside surface 50b (identified in FIG. 3) of foil 50 (as shown in FIG. 5), or to an inside surface 50a (identified in FIG. 3) between gasket 10 and foil 50 (as shown in FIG. 4) or to both surfaces 50a and 50b (not shown) is also desirable in alternative embodiments. In this form (FIG. 5) (and in that shown in FIG. 2), adhesive 40 is preferably covered by a release liner (not shown), and gasket 10 is then die-cut or otherwise fashioned into a specific shape. The cut gasket 10 then has its release liner peeled away, exposing the adhesive 40, and gasket 10 is subsequently placed onto a printed circuit board (PCB) or shield cover.

Vacuum fixtures (as described in U.S. Pat. Nos.: 5,660,380; 5,782,152; 5,800,661; 5,870,937; and 5,906,363) may be used to aid in the installation of the die-cut gasket to the printed circuit board, or shield cover. The metal foil provides dimensional stability and easier peeling of the adhesive's release liner during installation (such as with an aforementioned vacuum fixture) to the PCB or shield, as well as a carrier to aid in die-cutting and processing the metallized foam material.

It is another purpose of the present invention to provide a conductive gasket that has a metal shim attached to one side of the gasket. The construction of this embodiment is similar to that described above in connection with FIGS. 3 and 4, except that in this embodiment, it is desirable for foil 50 to be thicker than in the previous embodiment. The thickness of foil 50 when used as a shim is preferably from about 0.01 mm to about 1.0 mm thick. In this form gasket 10 is adapted to be die-cut into small parts with dimensions of 0.5 to 5.0 mm wide and 1.0 to 20 mm long, for example. These parts may then be placed into a tape-and-reel package to be used on an automated pick-and-place surface mount technology machine. These parts would typically be placed along a ground trace on the printed circuit board and would function as an EMI gasket (or grounding pad), as discrete components.

While this invention has been illustrated and described in accordance with a preferred embodiment, it is recognized that variations and changes may be made therein without departing from the invention as set forth in the following claims.

What is claimed is:

1. An electrically conductive gasket comprising:
   an open-celled foam substrate having a skeletal structure and a pore density of from about 80 to about 250 pores per 25.4 mm; and
   a metal coating deposited onto the skeletal structure; and
   in the absence of a substantially non-metallic conductive coating over the metal coating, wherein the metal coating consists of nickel,
   wherein the gasket has a volume resistivity of less than 10 ohm-cm; and
   wherein said gasket is substantially deformable with less than 50 psi of pressure; and
   wherein said gasket is substantially recoverable after said pressure is removed.

2. An electrically conductive gasket as defined in claim 1 wherein said open-celled foam has a pore density of between 80 and 140 pores per 25.4 mm.

3. An electrically conductive gasket, as defined in claim 1 wherein the open-celled foam substrate has a thickness of less than about 10 mm in an uncompressed state.

4. An electrically conductive gasket, as defined in claim 1 wherein the open-celled foam substrate has a thickness of between 0.5 mm and 3.0 mm in an uncompressed state.

5. An electrically conductive gasket as defined in claim 1 wherein said gasket has a surface and further comprises an adhesive disposed on said surface.

6. An electrically conductive gasket as defined in claim 5 wherein said adhesive is a conductive adhesive.

7. An electrically conductive gasket as defined in claim 1 wherein said gasket has a surface and further comprises a metal foil attached to said surface.

8. An electrically conductive gasket as defined in claim 7 wherein said metal foil is attached to said surface by an adhesive.

9. An electrically conductive gasket as defined in claim 7 further comprising an adhesive disposed on an outer surface of said metal foil.

10. An electrically conductive gasket, as defined in claim 1 and wherein at least some of the nickel coating is deposited onto the open-celled foam via an electrolytic process.

11. An electrically conductive gasket, as defined in claim 1, and wherein the metallic coating is present in an amount less than 150 g/m$^2$.

12. An electrically conductive gasket, as defined in claim 1, and wherein the metallic coating is present in an amount less than 125 g/m$^2$.

13. An electrically conductive gasket, as defined in claim 1, and wherein the metallic coating is present in an amount less than 100 g/m$^2$.

14. An electrically conductive gasket, as defined in claim 1, and wherein the metallic coating is present in an amount less than 75 g/m$^2$.

15. An electrically conductive gasket, as defined in claim 1, and wherein the metallic coating is present in an amount less than 50 g/m$^2$.

16. An electrically conductive gasket, as defined in claim 1, and wherein the metallic coating is present in an amount of about 35 g/m$^2$.

17. An electrically conductive gasket, as defined in claim 1, and wherein the metallic coating has a total thickness in an amount of less than 5 microns.

18. An electrically conductive gasket, as defined in claim 1, which achieves a shielding level of greater than 40 dB in a frequency range from about 10 MHz to about 3 GHz.

19. An electrically conductive gasket, as defined in claim 1, wherein said gasket is able to recover at least 10% of the amount it is compressed after the pressure is removed.

20. An electrically conductive gasket, as defined in claim 1, wherein said gasket is able to recover at least 20% of the amount it is compressed after the pressure is removed.

21. An electrically conductive gasket having an open-celled foam substrate which is substantially deformable with less than 50 psi of pressure and substantially recoverable after said pressure is removed and has between 80 and 140 pores per 25.4 mm; and a metal or combination of metals deposited throughout the open-celled foam substrate with a total thickness of less than 5 microns, such that the gasket is conductive throughout the open-celled foam substrate, said gasket made by the process comprising the steps of first sputtering said metal onto said foam and then electroplating the said metal or another metal onto said foam wherein said metal consists of nickel.

22. A method of filling a gap in an EMI shielded system comprising the step of disposing in said gap a gasket according to claim 1.

23. An electrically conductive gasket as defined in claim 1 wherein said open-celled foam comprises polyether-type polyurethane.

24. An electrically conductive gasket as defined in claim 1 wherein pore density is about 94 pores per 25.4 mm.

* * * * *